(12) United States Patent
Marsland, Jr. et al.

(10) Patent No.: US 9,841,447 B2
(45) Date of Patent: Dec. 12, 2017

(54) APPARATUS ENABLING USE OF A REFERENCE DIODE TO COMPARE AGAINST A DEVICE UNDER TEST IN RELATIVE AMPLITUDE AND PHASE MEASUREMENTS

(71) Applicant: Tektronix, Inc., Beaverton, OR (US)

(72) Inventors: Robert A. Marsland, Jr., Madison, WI (US); Steven A. Jacobs, Madison, WI (US)

(73) Assignee: Tektronix, Inc., Beaverton, OR (US)

(*) Notice: Subject to any disclaimer, the term of this patent is extended or adjusted under 35 U.S.C. 154(b) by 202 days.

(21) Appl. No.: 14/945,395

(22) Filed: Nov. 18, 2015

(65) Prior Publication Data

US 2016/0146869 A1    May 26, 2016

Related U.S. Application Data

(60) Provisional application No. 62/083,148, filed on Nov. 21, 2014, provisional application No. 62/211,614, filed on Aug. 28, 2015.

(51) Int. Cl.
*H04B 10/00* (2013.01)
*G01R 25/00* (2006.01)
(Continued)

(52) U.S. Cl.
CPC .............. *G01R 25/00* (2013.01); *G01J 1/44* (2013.01); *H04B 10/0731* (2013.01); *H04B 10/615* (2013.01); *H04B 10/63* (2013.01)

(58) Field of Classification Search
CPC .. G01R 25/00; H04B 10/0731; H04B 10/615; H04B 10/63; G01J 1/44
See application file for complete search history.

(56) References Cited

U.S. PATENT DOCUMENTS 4,492,962 A * 1/1985 Hansen ............... H01Q 3/2605
342/369
5,202,745 A * 4/1993 Sorin ................. G01M 11/3172
356/479

(Continued)

FOREIGN PATENT DOCUMENTS

DE     4110138 C1    3/1992
EP     0319174 A2    6/1989
(Continued)

OTHER PUBLICATIONS

Extended European Search Report for European Patent Application No. 15195904.6, dated Apr. 15, 2016, 8 pages.

(Continued)

*Primary Examiner* — Danny Leung
(74) *Attorney, Agent, or Firm* — Marger Johnson

(57) ABSTRACT

Embodiments of the invention include methods and devices for determining a phase angle offset between a phase angle of a local oscillator relative to a phase angle of a signal input of a Device Under Test (DUT). Some embodiments include a laser source and an optical phase adjustor, which may be embodied by a loop stretcher structured to controllably stretch a length of fiber optic cable, driven by a phase adjust driver. In other embodiments the phase angle offset information is conveyed to an oscilloscope for internal compensation.

18 Claims, 7 Drawing Sheets

(51) Int. Cl.
*G01J 1/44* (2006.01)
*H04B 10/63* (2013.01)
*H04B 10/073* (2013.01)
*H04B 10/61* (2013.01)

(56) References Cited

U.S. PATENT DOCUMENTS

| | | | | |
|---|---|---|---|---|
| 2002/0113972 | A1* | 8/2002 | Rosenfeldt | G01J 4/04 |
| | | | | 356/477 |
| 2004/0208643 | A1 | 10/2004 | Roberts et al. | |
| 2008/0024785 | A1* | 1/2008 | Froggatt | G01M 11/3172 |
| | | | | 356/450 |
| 2009/0103100 | A1* | 4/2009 | Froggatt | G01M 11/3172 |
| | | | | 356/477 |
| 2011/0129213 | A1* | 6/2011 | Painchaud | H04B 10/676 |
| | | | | 398/16 |
| 2014/0341564 | A1* | 11/2014 | Westlund | H04B 10/0731 |
| | | | | 398/16 |
| 2016/0146869 | A1* | 5/2016 | Marsland, Jr. | H04B 10/0731 |
| | | | | 324/76.77 |
| 2016/0149637 | A1* | 5/2016 | Marsland, Jr. | H04B 10/63 |
| | | | | 398/25 |
| 2016/0164599 | A1* | 6/2016 | Heismann | H04B 10/07953 |
| | | | | 398/26 |

FOREIGN PATENT DOCUMENTS

| | | |
|---|---|---|
| EP | 0479256 A2 | 4/1992 |
| EP | 2026478 A1 | 2/2009 |
| GB | 2213026 | 8/1989 |

OTHER PUBLICATIONS

Extended European Search Report for European Patent Application No. 15195909.5, dated Aug. 25, 2016, 8 pages.

* cited by examiner

APPARATUS ENABLING USE OF A REFERENCE DIODE TO COMPARE AGAINST A DEVICE UNDER TEST IN RELATIVE AMPLITUDE AND PHASE MEASUREMENTS

CROSS REFERENCE TO RELATED APPLICATIONS

This application claims benefit from U.S. Provisional Application 62/083,148, filed Nov. 21, 2014, entitled TEST AND MEASUREMENT DEVICE, and also claims benefit from U.S. Provisional Application 62/211,614, filed Aug. 28, 2015, entitled APPARATUS FOR MEASURING FREQUENCY RESPONSE OF AN INTEGRATED COHERENT OPTICAL RECEIVER FRONT END USING EQUIVALENT-TIME SAMPLING. This application is also related to U.S. patent application Ser. No. 14/873,997, entitled TEST AND MEASUREMENT DEVICE FOR MEASURING INTEGRATED COHERENT OPTICAL RECEIVER. The contents of all of the applications referred to in this paragraph are incorporated by reference herein.

FIELD OF INVENTION

This disclosure generally relates to test and measurement devices, and, more particularly, to an apparatus that enables testing the frequency response of an Integrated Coherent Optical Receiver (ICR) using oscilloscopes.

BACKGROUND

Optical communication systems transmit data using electromagnetic light signals in optical fiber and/or free space (for example, building to building, ground to satellite, satellite to satellite, etc.). The electromagnetic carrier wave is modulated to carry the data. Optical communication in optical fiber typically involves: generating the optical signal, relaying the signal on an optical fiber (including measures to reduce/mitigate attenuation of, interference with and/or distortion of the light signal), processing a received optical signal, and converting the signal into a useful electrical signal. Transmitters can be semiconductor devices such as laser diodes, producing coherent light for transmission. A number of receivers have been developed for processing a transmitted lightwave optical signal to provide processed optical signal input(s) to one or more photodetectors, which convert light into electricity.

A coherent receiver, such as an Integrated Coherent Optical Receiver (ICR), converts a modulated optical signal into four electrical signals corresponding to an "in-phase" (I) and "quadrature" (Q) optical signal components of the two optical polarization states, vertical and horizontal. These components can be processed to recover the optically transmitted data regardless of modulation type. Thus, the four output electrical signals from the ICR carry all or nearly all of the information conveyed by the optical signal.

Testing an ICR presents a special challenge in that the output stage is a balanced detector pair often followed by a differential amplifier with differential outputs. The fact that there are four differential outputs (I and Q each for X and Y polarizations), compounds the difficulty. A simple coherent receiver is composed of a local-oscillator laser, an optical coupler, and one or more photodetectors that can be in a "balanced" configuration that cancels photocurrents and eliminates DC terms and the related excess intensity noise.

The balanced detection and differential amplification of the ICR ensure that any signal put into only the signal port or only the Local Oscillator (LO) port of the ICR will be rejected unless it is possible to block one of the photodiodes to break the balanced detection. Although early versions of ICRs allowed physical access to interrupt a light signal and thereby break the balanced detection, this is not possible on modern integrated components, which are instead typically intrinsically sealed. Getting any meaningful signal out of the ICR therefore requires both a signal and a LO input. This requirement can complicate some desired measurements to be performed on a Device Under Test (DUT), where the optical LO input must be phase coherent with the test signal input.

Because the ICR requires both a signal and a local oscillator input to provide meaningful output, the frequency and phase relationship between the two input signals are important. While it is simplest to split the LO and Signal lasers and then connect them to a reference coherent receiver front end and a Device Under Test (DUT), the separate fiber paths required by this configuration can introduce an unknown phase difference between the input signals.

Embodiments of the present invention determine, correct for, and/or control a phase difference between the local oscillator signal and the test signal input to a DUT. This ability can be used to restore the phase coherence needed for certain desired performance tests of the DUT.

BRIEF DESCRIPTION OF THE DRAWINGS

Reference is made to embodiments of the invention, examples of which may be illustrated in the accompanying figures. These figures are intended to be illustrative, not limiting. Although the invention is described in the context of these embodiments, it should be understood that this description is not intended to limit the scope of the invention to these particular embodiments.

DETAILED DESCRIPTION OF THE INVENTION

The following detailed description will refer to one or more embodiments, but the present invention is not limited to such embodiments. Rather, the detailed description and any embodiment(s) presented are intended only to be illustrative. Those skilled in the art will readily appreciate that the detailed description given herein with respect to the Figures is provided for explanatory purposes as the invention extends beyond these limited embodiments.

Certain terms are used throughout the description and claims to refer to particular system components. In the following discussion and in the claims, the terms "including" and "comprising" are used in an open-ended fashion, and thus should be interpreted to mean "including, but not limited to . . . ." Phrases such as "coupled to" and "connected to" and the like are used herein to describe a connection between two devices, elements and/or components and are intended (unless otherwise restricted specifically) to mean physically, optically and/or electrically either coupled directly together, or coupled indirectly together, for example via one or more intervening elements or components or via a wireless or other connection, where appropriate. The term "system" refers broadly to a collection of two or more components and may be used to refer to an overall system (e.g., a communication system, a receiving system, a testing system, a computer system or a network of such devices/systems), a subsystem provided as part of a larger system, and/or a process or method pertaining to operation of such a system or subsystem.

Probably the most important characteristics to be measured of a Device Under Test (DUT) are the shapes of its amplitude and phase response at various frequencies. A difficulty with measuring these characteristics, as mentioned above, is that the ICR used for testing produces no meaningful output unless two inputs are present, a signal input and a local oscillator (LO) input. For the accurate measurement of the amplitude and phase response, the two inputs to the ICR must be phase coherent. This requirement is addressed in some embodiments of the present invention by the inclusion of a phase controller including an optical phase-locked-loop. Other embodiments use various methods of evaluating and correcting the phase relationship. Embodiments of the invention restore phase coherence by using an LO having a tunable phase adjust, or by providing a measurement of the amount by which the LO and Signal are out of phase. This latter quantity can be used in subsequent processing to correct the phase and amplitude response of the DUT.

Figure 1:
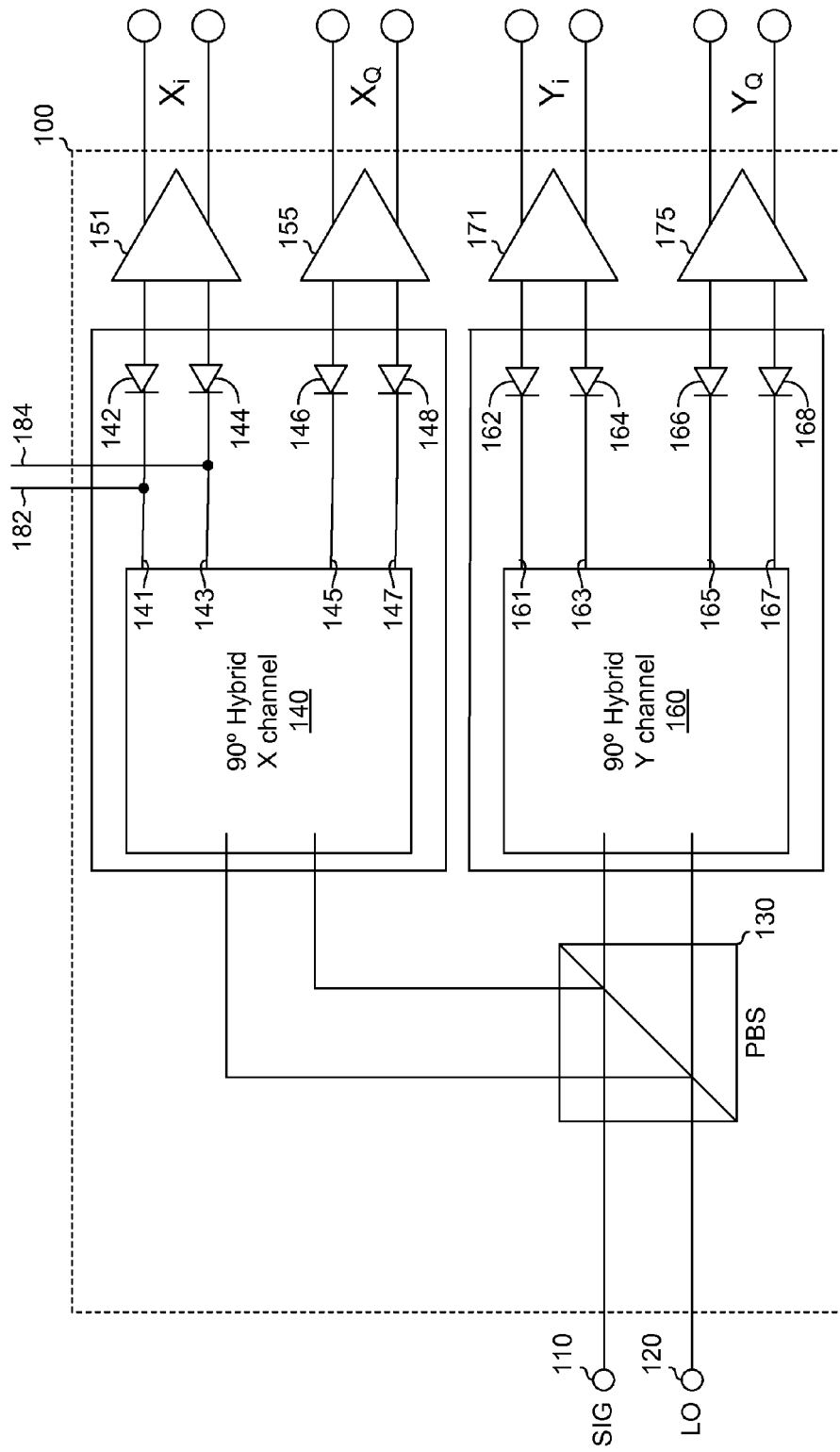
FIG. 1 is a block diagram illustrating components of an Integrated Coherent Optical Receiver to be tested using embodiments of the invention.

As seen in FIG. 1, a generalized optical signal processor 100, which can be used as an optical signal receiver or an optical testing device, for example, accepts an unprocessed data signal beam 110 at a SIG input as well as a local oscillator beam 120 at an LO input. The optical signal processor 100 may also be referred to as a Device Under Test (DUT). In some embodiments the beams 110, 120 may be laser beams, but embodiments of the invention also work in typical RF frequencies. The laser used for the local oscillator 120 can be any suitable laser source and type (for example, continuous wave, pulsed, etc.). A Polarized Beam Splitter (PBS) 130 splits the beams 110, 120 into two channels. As noted below, and as will be appreciated by those skilled in the art, the local oscillator 120 should preferably be oriented so that sufficient reference local oscillator power is available downstream along any needed polarizations. In some embodiments discussed herein, such polarizations may be referred to as "X" and "Y" polarizations (as well as other orientation representations such as "vertical" and "horizontal", etc.), though such nomenclature only serves to describe the relative polarization orientations, as do references to 45° offsets and/or axes relative to such horizontal and/or vertical polarization orientations. Those skilled in the art will appreciate that many equivalent structures, apparatus, etc. are available once the relative polarization schemes, etc. are known.

An X-channel optical mixer 140 combines the signal 110 and LO inputs 120 of the X-channel output of the PBS 130 to produce a differential in-phase (I) output on outputs 141, 143, and a differential quadrature (Q) output on outputs 145, 147. These outputs are directed to photodetectors, such as photosensitive diode pairs 142, 144, and 146, 148. The photodiodes 142, 144, 146, 148 of the signal processor 100 may be coupled to an amplifier, such as transimpedance amplifiers 151, 155, and/or other components well known to those skilled in the art and used to extract data from the signal beam 110. Embodiments of the invention operate even in absence of other components coupled to the photodiodes 142, 144, 146, 148. Current monitors 182, 184 may be coupled to the outputs of the photosensitive diode pairs 142, 144, respectively. Such a monitor allows each photodiode, referred to as P and N, for positive and negative, from each channel, to be monitored. For example, the current monitor 182 monitors the P photodiode 142 of the XI channel, while the current monitor 184 monitors the N photodiode 144 of the XI channel. Although not illustrated, each of the channels XQ, YI, and YQ may include current monitors for the P and N photodiodes, so that each of the outputs of the photodiodes in each channel may be individually monitored.

Similarly, a Y-channel optical mixer 160 combines the signal 110 and LO inputs 120 of the Y-channel to produce a differential in-phase (I) output on outputs 161, 163, and a differential quadrature (Q) output on outputs 165, 167. These outputs are directed to photodetectors, such as photosensitive diode pairs 162, 164, and 166, 168. The photodiodes 162, 164, 166, 168 of the signal processor 100 of FIG. 1 are coupled to transimpedance amplifiers 171, 175, respectively, but such amplifiers are not needed to practice embodiments of the invention.

As mentioned above, it is difficult to test the frequency responses of the photodiodes of the X and Y channels without having physical access to block light to one of the pairs of diodes. It is also very difficult to test the frequency responses of the photodiodes without an ability to precisely control the frequency of the local oscillator beam 120, especially a local oscillator that oscillates at the very high optical carrier frequencies, such as 192 THz. Another problem exists in that the fiber carrying the signal 110 may have a different length than the fiber carrying the local oscillator 120, which makes it difficult to match phases of the signal and local oscillator. Therefore, embodiments of the invention provide an apparatus and method to hold the phase of the local oscillator extremely stable, and well matched to the phase of the signal, as well as being controllable, to facilitate measurement of the frequency responses of the photodiodes.

Figure 2:
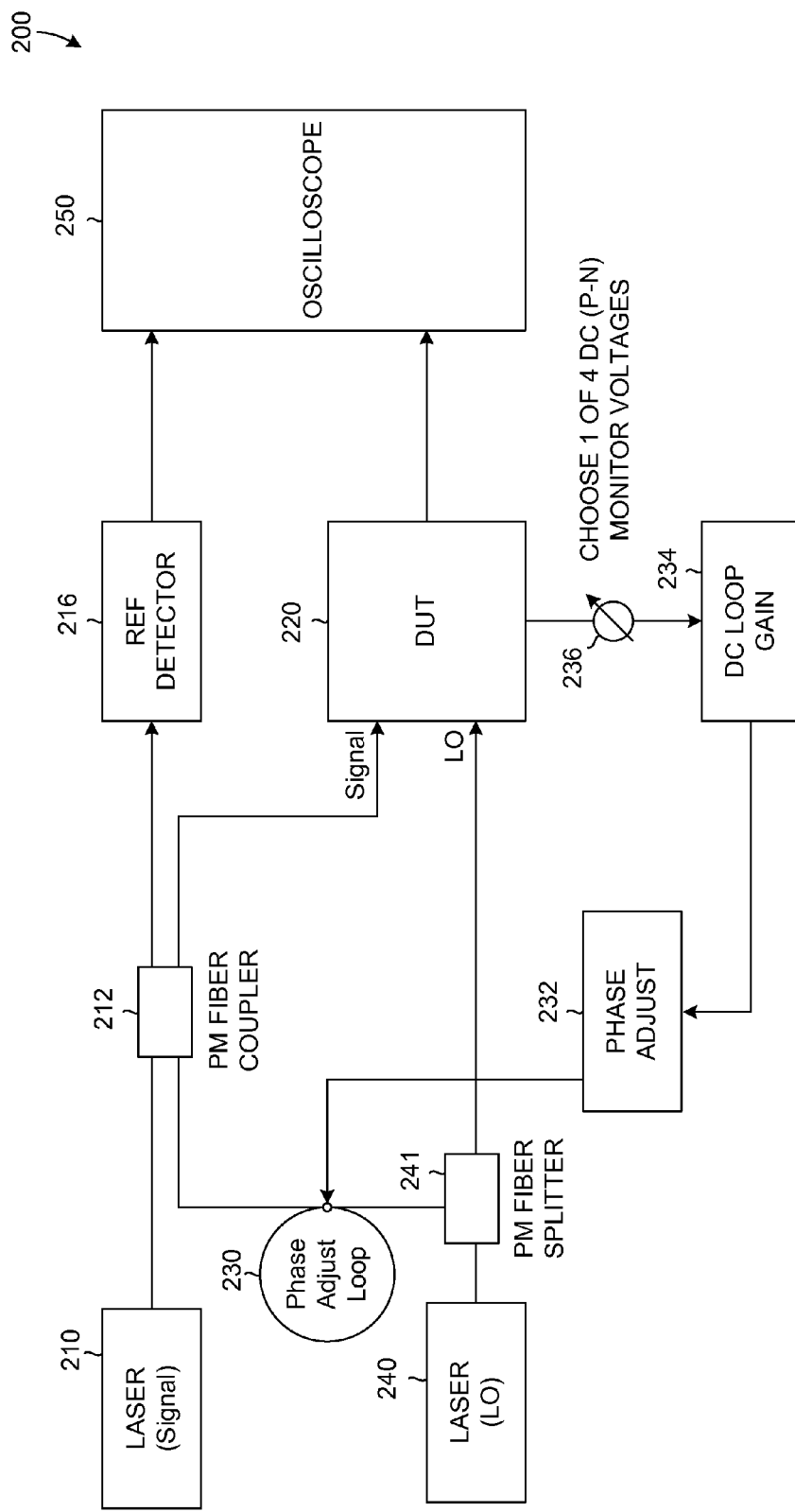
FIG. 2 is a block diagram illustrating components of a precise phase adjusting system that may be used in implementing embodiments of the invention.

Using the arrangement shown in FIG. 2, a delay (or phase) locked loop can be used to drastically reduce the phase wander between the reference and DUT paths. In addition, the methods described herein lend themselves well to the use of a reference photodiode rather than a reference coherent receiver front end, drastically reducing the cost of the testing setup. The technique can be extended for use with equivalent time oscilloscopes.

One embodiment creates a reference signal by combining two lasers in a Phase Maintaining (PM) coupler. With reference to FIG. 2, a laser 240 generates an LO signal that is split in a PM splitter 241. One output of the PM splitter 241 becomes the LO input for a DUT 220. The Signal input for the DUT 220 is generated by a laser 210. A difficulty in measuring the performance of the DUT 220 is providing the LO at the DUT 220 at the same phase with respect to the Signal, generated by the laser 210, that is seen at the reference detector 216. Embodiments of the invention address this difficulty by precisely controlling the phases of the LO and the Signal relative to each other. First, the output of the laser 240 is split in a PM fiber splitter 241. One output of the fiber splitter 241 becomes the LO input to the DUT, as described above. The other output of the fiber splitter 241 passes through a phase adjust loop 230 to a 2×2 PM fiber coupler 212. The fiber coupler 212 first duplicates the Signal output from laser 210 on both outputs, one going to the reference detector 216, and the other going to the Signal input for the DUT. The phase of the outputs of the fiber coupler 212 is controlled by the phase of the output of the laser 240, that was split in the fiber splitter 241, but only after the output passes through a phase or delay locked loop 230. The error signal to control the loop 230 is the beat signal between the light output from the first laser 210 that travels through the PM fiber coupler 212 to the reference detector 216, and the light output from the first laser 210 that travels directly to the DUT 220. By adjusting the phase of the latter to match the former, an identical optical test signal is created at both the reference detector 216 and the Signal input of the DUT 220, allowing an oscilloscope 250 to monitor the desired signals.

The phase adjust driver 232 controls the phase adjust loop 230 to select particular phases and provide a stable phase reference of the local oscillator relative to the signal. The level to which the phase adjust driver 232 is driven is related to its input, called an error input, for reasons described below. This error input is generated in what is referred to as DC loop gain block 234. The error input from the loop gain block 234 to the phase adjust driver 232 is a selected one or pair of current monitors from the DUT 220. A monitor selector 236 controls which of the monitored channel outputs of the DUT 220 is provided as the error input of the phase adjust driver 232 to cause the phase adjust loop 230 to shift the phase of the LO input relative to the Signal input of the DUT. For example, the error input to the phase driver could be the current monitors 182, 184 of the XI channel as illustrated in FIG. 1, or any of the other monitored channels of the optical signal processor 100 of FIG. 1. The error input to the phase adjust driver 232 can perform both a dc-bias function as well as the phase adjust function. In this way it can completely take over for the user bias circuitry of prior solutions, eliminating the need for any such interaction between the test system and the bias circuitry of the user. In addition, the phase adjust driver 232 can also be used to measure photocurrents of the DUT 230 outputs to determine DC Common Mode Rejection Ratio (CMRR) for example.

The phase adjuster, such as the phase adjust loops illustrated in FIG. 2 may be embodied by a piezo phase stretcher. A piezo phase stretcher has loops of fiber optic cable looped around a piezoelectric element. Energizing the piezoelectric element causes the element to expand, which lengthens the path of the fiber optic material looped around it. Lengthening the path changes the distance the light travels through the path. Lengthening only one of the paths, Signal or LO, allows the phase of one signal to be adjusted relative to the other. In one embodiment the phase adjust loop may allow light traveling through the loop to be adjusted extremely accurately, such as on the order of tenths or hundredths of a picosecond. In other words, by using the phase stretcher, the fiber length that the laser light travels through may be lengthened to cause the light traveling through it to take, for example, 0.1 ps longer than the fiber in its non-stretched length. This changes the relative phase of the light signals between the LO and the Signal inputs of the DUT. Therefore, driving the phase adjuster gives phase precise phase control to the system. The length of both laser paths from the laser for both the Signal and LO may be set up to be similar length to one another, for example within one meter. The phase adjust loop in some embodiments may be an OptiPhase PZ1-PM4-APC-E-155B, and may have a fiber length of 12.36 m, for instance. Of course, other methods of adjusting the phase other than using a piezo phase stretcher are possible without deviating from the spirit of the invention.

Providing a signal to a DUT that is phase stable and controllably locked relative to the LO in a known relationship allows the same results to be obtained from the DUT as if the balanced detection were able to be physically blocked, as in previous solutions, as proven by the theory of operation shown below.

Signal Field: $\widetilde{E_1} = E_1 e^{j\omega_1 t} = E_{10} e^{j\theta_1} e^{j\omega_1 t}$  Equation (1):

LO Field: $\widetilde{E_2} = E_2 e^{j\omega_1 t} = E_{20} e^{j\theta_2} e^{j\omega_1 t}$  Equation (2):

For simple amplitude modulation of $E_{10}$ with a balanced drive, the output of the DUT for a particular polarization will be proportional to:

I: $E_{10} E_{20} \cos(\theta_1 - \theta_2)$  Equation (3):

Q: $E_{10} E_{20} \sin(\theta_1 - \theta_2)$  Equation (4):

A phase-locked loop with the Q dc level output provided as the error input can then be used to drive the $\theta_1 - \theta_2$ to zero, providing an output on the I-channel that is proportional to $E_{10}$, which gives the response of the positive diode of the differential pair, such as the diode 142 of the differential pair of diodes 142, 144 of FIG. 1. Driving $\theta_1 - \theta_2$ to π gives $-E_{10}$, which is the response of the negative diode, such as diode 144. This response signal may be selected in the phase adjust driver by changing the sign of the gain. Any of the four photodiode pair outputs from the DUT may be selected to be the error input for the phase adjust driver. Therefore, in the above example, selecting the error input signal of the phase adjust driver to the level driven by the I dc output from the DUT gives the desired output on the Q channel. A monitor selector, such as the monitor selector 236 of FIG. 2 controls which of the monitored channel outputs of the DUT is provided as the error input of the phase adjust driver to cause the phase adjust loop to shift the phase of the LO input relative to the Signal input of the DUT.

Figure 3:
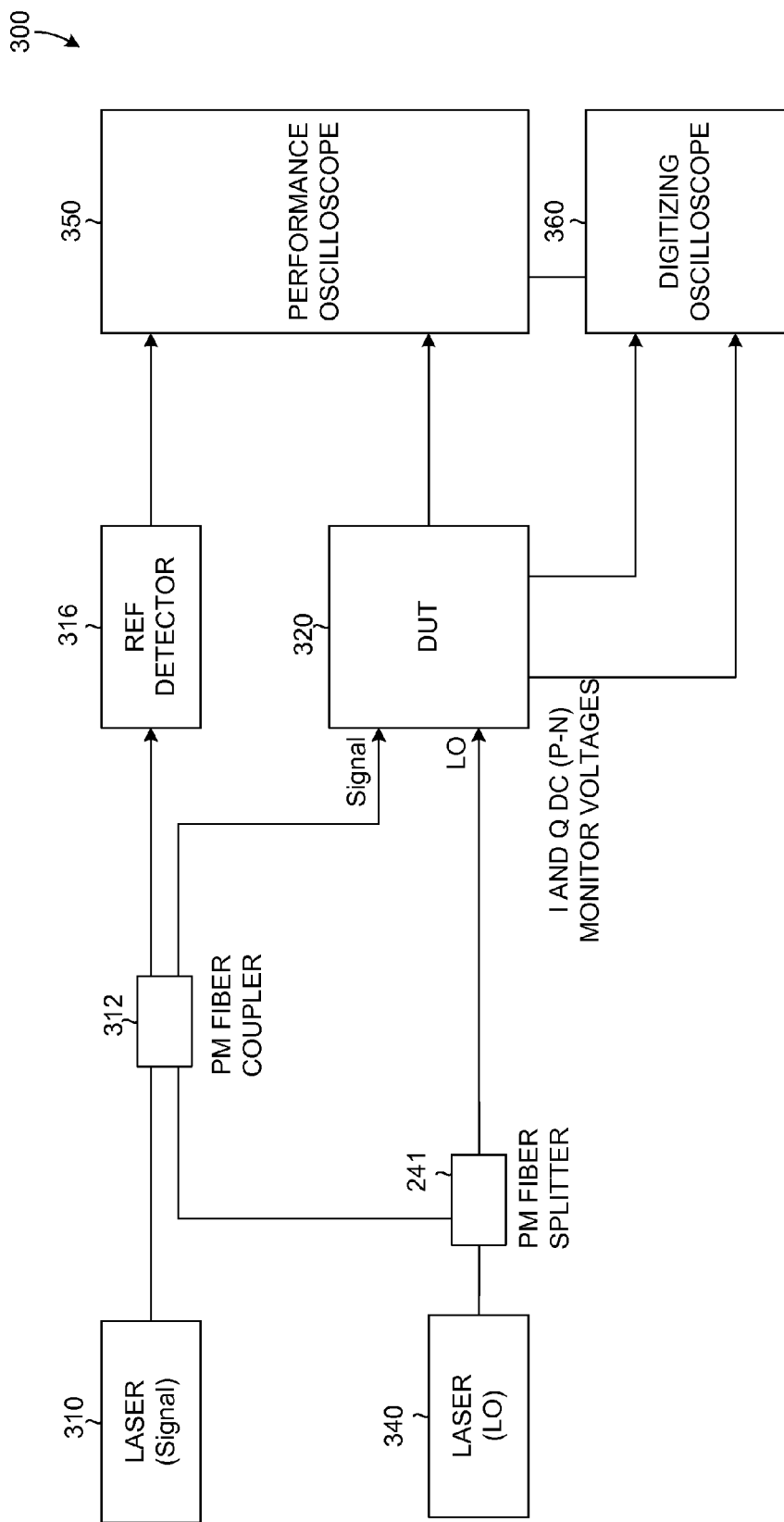
FIG. 3 is a block diagram illustrating components of a precise phase adjusting system that may be used in implementing embodiments of the invention.

If the DC monitor signals are available from the DUT, but phase locking is not sufficiently robust, matching the phase of the Signal to the LO can be done in software, as illustrated in FIG. 3. The testing setup of FIG. 3 is similar to that of FIG. 2, except a digitizing oscilloscope 360 is coupled to a DUT 320. No phase adjust loop is driven in this embodiment, and instead the DC monitor signals from the DUT 320 are fed to the digitizing oscilloscope 360. The digitizing oscilloscope 360 interprets the desired DC monitor signal and informs a performance oscilloscope 350 a phase adjust amount for precisely aligning the signals received at the LO and Signal inputs.

Figure 4:
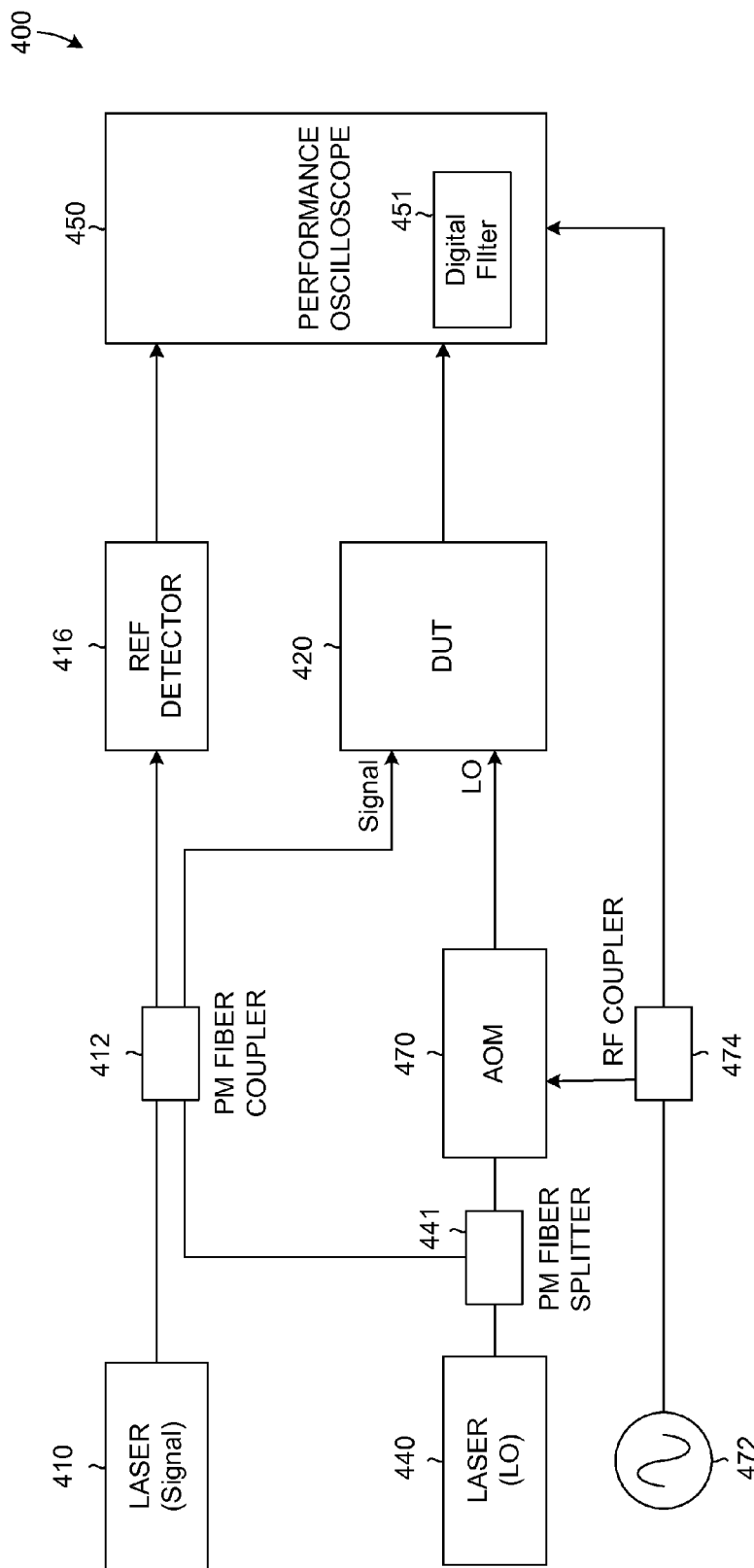
FIG. 4 is a block diagram illustrating components of a precise phase adjusting system that may be used in implementing embodiments of the invention.

Since sometimes even the DC monitor outputs from the DUT are not available, an alternative method to adjust the Signal relative to the LO can be used to determine the appropriate phase correction between the DUT and reference paths, as illustrated in FIG. 4.

In FIG. 4, the beat frequency between the laser 410 output at the reference detector 416 and the laser 410 output read at the DUT 420 will be available at an operational frequency of an Acoustic Optic Modulator (AOM) 431, such as approximately 80 MHz. This can be separated out from the DUT 420 response using a digital filter 451 in the oscilloscope 450. During subsequent analysis, the phase of the 80 MHz signal is subtracted from the measured DUT 420 rf signal to correct for phase wander between the two paths.

In these cases, the fields at the DUT are as follows (neglecting losses for simplicity):

$$\widetilde{E_{Sig}} = E_1 e^{j\omega_1 t} + E_2 e^{j\omega_2 t} = E_{10} e^{j\theta_1} e^{j\omega_1 t} + E_{20} e^{j\theta_2} e^{j\omega_2 t} \quad \text{Signal Field:}$$

$$\widetilde{E_{LO}} = E_2 e^{j\omega_2 t} e^{j\phi} = E_{20} e^{j\theta_2} e^{j\omega_2 t} e^{j\delta\omega t} e^{j\phi} \quad \text{LO Field:}$$

The E*E product that occurs in the DUT is then:

$$v_{DUT} =$$

$$H_{DUT}(\omega)\widetilde{E_{Sig}}\widetilde{E_{LO}^*} = H_{DUT}(\omega_1 - \omega_2 - \delta\omega) E_{10} E_{20} e^{j\theta_1 - j\theta_2 - j\varphi} e^{j\omega_1 t - j\omega_2 t - j\delta\omega t} + H_{DUT}(\delta\omega) E_{20}^2 e^{-j\varphi} e^{-j\delta\omega t}$$

And the real part (taking $H_{DUT}(\delta\omega)=1$)

$$v_{DUT} = Re[H_{DUT}(\omega)\widetilde{E_{Sig}}\widetilde{E_{LO}^*}] = |H_{DUT}(\omega_1 - \omega_2 - \delta\omega)|E_{10}E_{20}$$
$$\cos[(\omega_1 - \omega_2 - \delta\omega)t + (\theta_1 - \theta_2) - \varphi + \theta_{DUT}] + |E_{20}|^2 \cos(\delta\omega t + \varphi)$$

While the inter-path phase can be determined from the second term by comparing with the drive signal for the AOM 470, which is generated by a signal generator 472 and coupled to the AOM by an RF coupler 474, this is not strictly necessary to extract the DUT phase. It is not necessary to measure the AOM drive signal unless the inter-path phase is of specific interest.

The field at the reference detector 416 is directly proportional to the Signal field, assuming a perfectly deskewed system where sampling instants of the oscilloscope 450 occur such that there is no phase delay difference between the Signal and reference detector paths. In this case, the voltage at the reference detector output is:

$$v_{REF} = Re[H_{REF}(\omega)\widetilde{E_{Sig}}\widetilde{E_{Sig}^*}] = |H_{REF}(\omega_1-\omega_2)|E_{10}^2$$
$$\cos[(\omega_1-\omega_2)t+(\theta_1-\theta_2)+\theta_{REF}]$$

Again, assuming a deskewed system so that "t" in both equations can be taken as the same time axis, the DUT output at $\omega_1-\omega_2+\delta\omega$ can now be compared to the reference detector amplitude and phase to determine $H_{DUT}(\omega_1-\omega_2+\delta\omega)$ relative to $H_{REF}(\omega_1-\omega_2)$ and $\theta_{DUT}$ relative to $\theta_{REF}$. This can be done even in the presence of fluctuations in $\phi$ which are expected due to the separate signal path. The correction is made easier by keeping the various path lengths approximately equal from laser 410 to the three optical inputs.

Since the DUT 420 and reference detector 416 see slightly different frequencies, it is also important to determine the response of the reference detector 416 at $\delta\omega$ offset from the test frequency, $\omega_1-\omega_2$, relative to its response at the test frequency. If the reference detector has been fully characterized, this requirement should not pose a significant difficulty since only the relative values are needed. The impact of this requirement can be reduced by lowering the modulation frequency $\delta\omega$. While 80 MHz is a typical value for an acousto-optic modulator, much lower frequencies are possible using serrodyne or single-side-band modulation techniques.

Figure 5A:
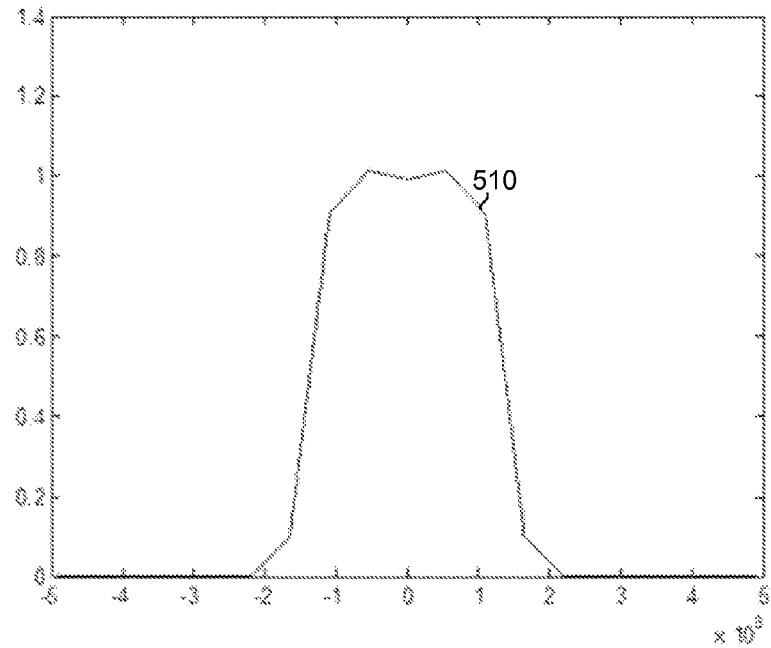
FIGS. 5A and 5B illustrate filters used in embodiments of the invention.
Figure 5B:
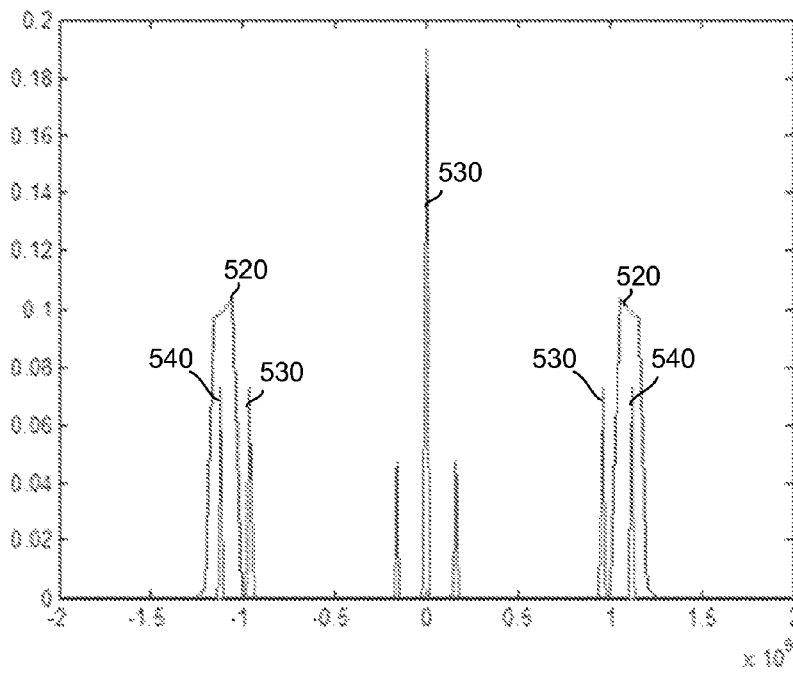
Figure 6:
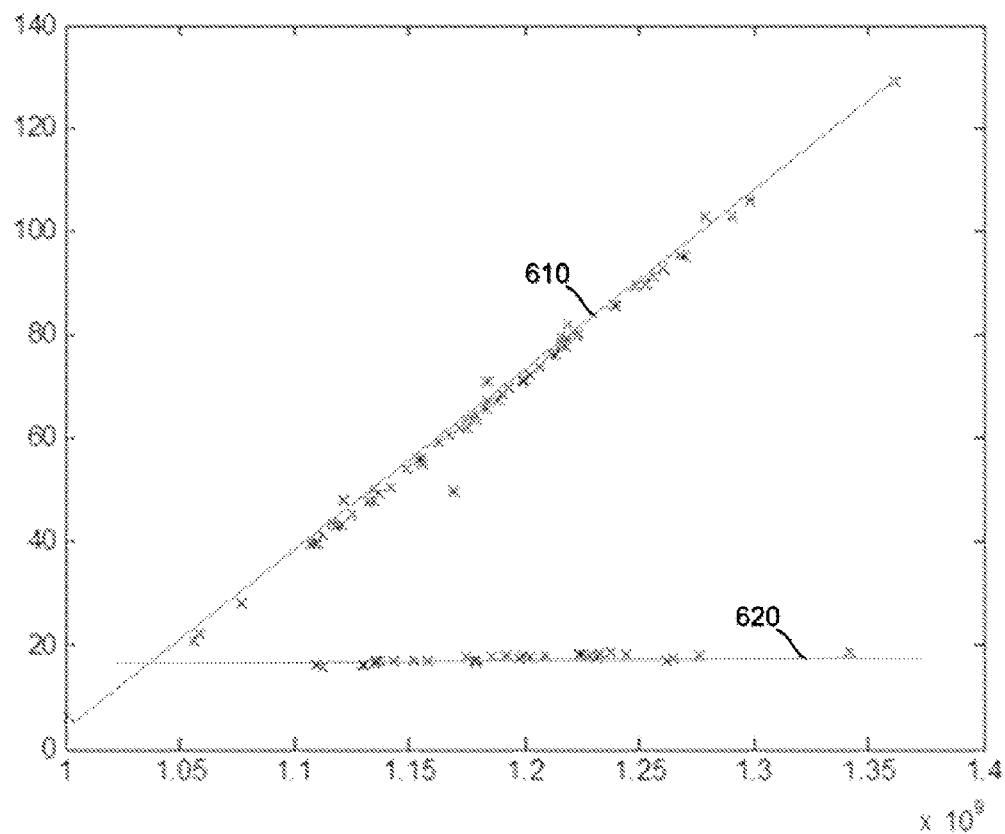
FIG. 6 is a graph illustrating phase vs. frequency data before and after deskewing according to embodiments of the invention.

An example method of phase comparison is demonstrated with reference to FIGS. 5A, 5B, and FIG. 6. The signal at $\delta\omega$ is separated from the DUT 420 signal with a low-pass filter, such as the filter 510 illustrated in FIG. 5A. This is then mixed with the DUT signal and filtered to reach the reference detector frequency, $\omega_1-\omega_2$. The sum term is desired both to compare signals of equal frequency as well as to get the proper sign to subtract the inter-path phase wander. After filtering, the phase is obtained by comparing to the reference detector signal using the arc-cosine of the dot-product, as shown above. In other words, the bandpass filter 510 is applied to the DUT 420 signal to extract the sum-frequency mixer term 520, as well as the input spectra 530 and the output signal spectra 540, as illustrated in FIG. 5B. The system may then be deskewed by plotting phase vs. test frequency to find theta vs. omega as illustrated in FIG. 6. This slope is the skew, which may be compensated to get the phase response of the DUT 420. In FIG. 6, the phase vs. frequency data before deskew is illustrated as the sloping line 610, and as the flat line 620 after deskew. The fact that the randomly fluctuating frequencies provide phase along a straight line that is reproducible proves that the phase fluctuations are removed successfully.

With reference still to FIG. 6, the skew computed from the slope of the phase/frequency graph is 952 ps. Adding this delay to the RefDet path (which was the shorter one) by introducing a Deskew value of –952 ps in the oscilloscope Deskew UI for that channel, gave repeatable phase values independent of frequency.

Alternatively, the signals $v_{ref}$ and $v_{DUT}$ can be sampled and stored with, for example, a digital oscilloscope. The frequency and phases that appear can be extracted from these stored data using any of a variety of mathematical techniques. One illustrative technique extracts the parameters by the least-squares fitting of the stored data to one general sinusoid (for $v_{ref}$) or the sum of two general sinusoids (for $v_{DUT}$) at different frequencies. This procedure, in particular, provides a value for the phase difference $\phi$ arising from the fiber path differences. This phase difference can then be removed to obtain the true phase response of the DUT. Generally, the fit of the data to the sinusoids is a nonlinear minimization problem, where an iterative technique must be used. A Fast Fourier Transform (FFT) of the voltage data usually provides good initial values for the sinusoid frequencies.

Figure 7:
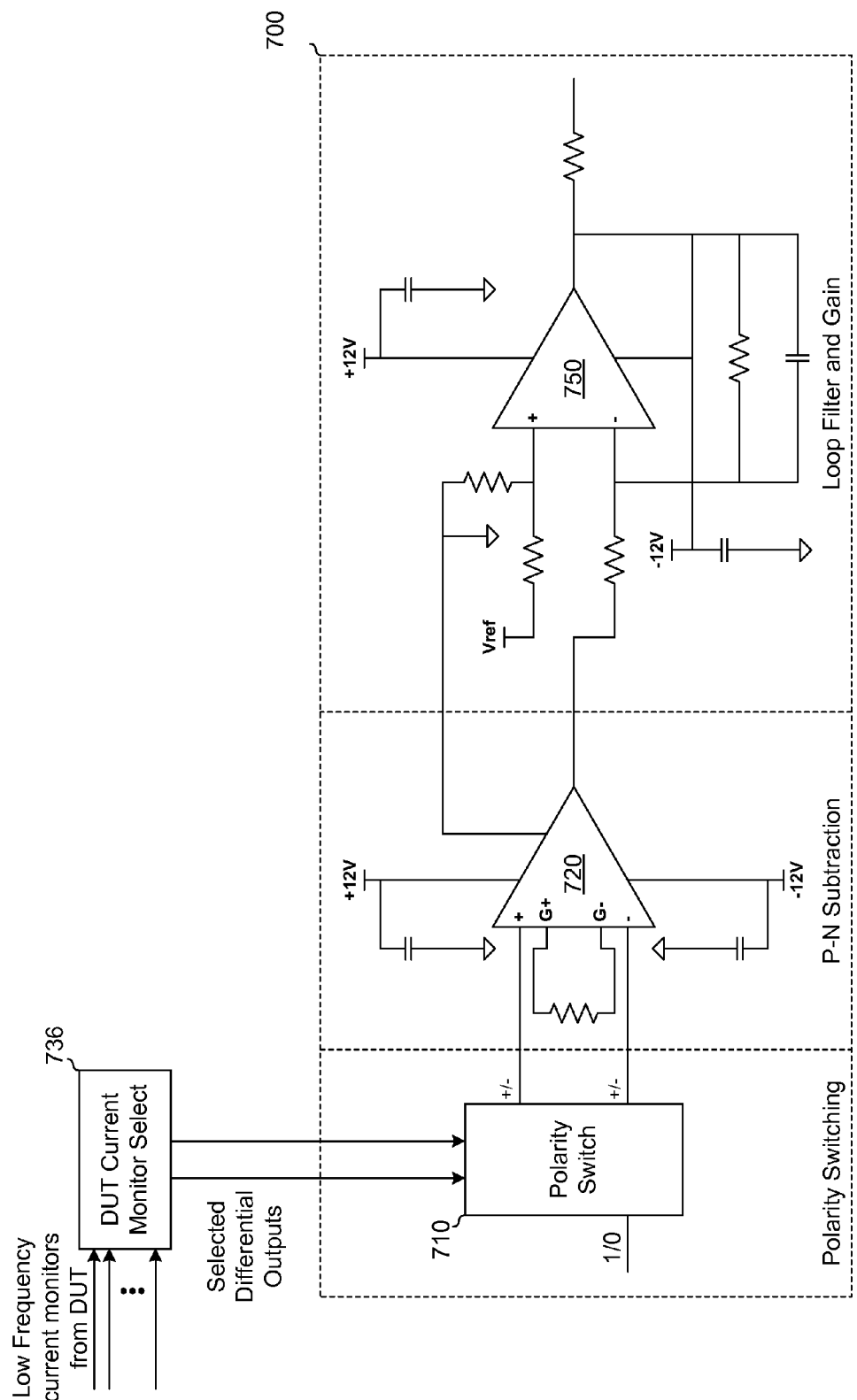
FIG. 7 is a block and schematic diagram illustrating a phase adjust driver according to embodiments of the invention.

FIG. 7 is a block and schematic diagram illustrating an example phase adjust driver according to embodiments of the invention. In this example, current monitor outputs are available from the DUT, such as the current monitors 182, 184 of FIG. 1. A monitor selector 736 selects the particular desired outputs from the DUT, which may be a pair of differential photocurrent outputs as illustrated in FIG. 1. The monitor selector 736 passes the selected outputs to a phase adjust driver 700, which may be an embodiment of the phase adjust driver 232 of FIG. 2. The phase adjust driver 700 may include several sections, such as a polarity switching section, a P–N subtraction section, and a section to perform loop filtering and gain.

In operation, the monitor selector 736 passes the selected photocurrent monitor outputs to a polarity switch 710 component of the phase adjust driver 700. The polarity switch 710 allows a user to change the polarity of the error signal, and therefore gives the user control to select which one of the pair of differential output diodes of the selected channel of the DUT will be tested.

The differential inputs, after the desired polarity is chosen by the polarity switch 710, are presented to a differential amplifier 720, which generates a voltage signal indicative of the difference of its input in the P–N subtractor section of the phase adjust driver 700. The output of the differential amplifier 720 is passed to another amplifier 730, which is in the loop filtering and gain section of the phase adjust driver 700. The output of the amplifier 730 is the output of the phase adjust driver 700 that drives the phase adjust loop 232 of FIG. 2, although, in some embodiments, the signal from the amplifier 730 may go through yet another amplifier or series of amplifiers to generate enough gain to drive the phase adjust loop 232.

In operation, the phase adjust driver 700 creates an output signal from an input, which itself is one of the monitored photocurrents of the DUT, for driving the phase adjust loop 232. The output signal of the phase adjust driver 700 keeps the phase of the LO input extremely precisely aligned with its desired position relative to the Signal input of the DUT. Further, the phase adjust driver 700 allows selection of different relative phases simply by changing which of the monitored photocurrents, of the DUT are chosen to be the selected inputs to the phase adjust driver 700. Plus, the polarity switch 710 allows the user to select which particular photodiode, P or N, of the differential pair of photodiodes is selected.

It shall be well understood to a person skilled in the art that the invention is not limited to any particular standard, but is applicable to systems having similar architecture without depraving from the inventive scope.

The foregoing description has been described for purposes of clarity and understanding. In view of the wide variety of permutations to the embodiments described herein, the description is intended to be illustrative only, and should not be taken as limiting the scope of the invention. Although specific embodiments of the invention have been illustrated and described for purposes of illustration, various modifications may be made without departing from the spirit and scope of the invention.

What is claimed is:

1. A system for determining a phase angle of a local oscillator relative to a phase angle of a signal input of a Device Under Test (DUT), comprising:
   a first laser source structured to generate the signal input for the DUT, and a signal input for a reference detector;
   a second laser source structured to generate a Local Oscillator input for the DUT;
   a phase maintaining laser coupler having two inputs and two outputs, the first input to the coupler coupled to the output of the first laser source, the second input to the coupler coupled to the output of the second laser source, the first output to the coupler coupled to the reference detector, and the second output to the coupler coupled to the DUT;
   a current monitor structured to monitor a selected one of a plurality of outputs of the DUT, the plurality of outputs of the DUT including in-phase and quadrature outputs for each of an X and a Y channel; and
   a phase measurer coupled to the output of the DUT selected by the current monitor, and structured to measure an error amount by which the LO is out of phase from the signal input to the DUT.

2. The system for determining a phase angle of a local oscillator relative to a phase angle of a signal input of a Device Under Test (DUT) according to claim 1, in which the phase measurer is a DC gain loop, and further comprising a phase adjuster coupled to the phase measurer and structured to modify a phase of the LO by an amount related to the output of the phase measurer.

3. The system for determining a phase angle of a local oscillator relative to a phase angle of a signal input of a Device Under Test (DUT) according to claim 2, in which the phase adjuster is a fiber loop stretcher.

4. The system for determining a phase angle of a local oscillator relative to a phase angle of a signal input of a Device Under Test (DUT) according to claim 2, in which the phase adjuster causes a phase angle difference of the signal input to the DUT and the LO input to the DUT to be controllably driven to approximately zero.

5. The system for determining a phase angle of a local oscillator relative to a phase angle of a signal input of a Device Under Test (DUT) according to claim 1, in which the phase measurer is a first oscilloscope coupled to the current monitor.

6. The system for determining a phase angle of a local oscillator relative to a phase angle of a signal input of a Device Under Test (DUT) according to claim 5 in which the first oscilloscope passes a measurement signal to a second oscilloscope.

7. A system for determining a phase angle of a local oscillator relative to a phase angle of a signal input of a Device Under Test (DUT), comprising:
   a first laser source structured to generate the signal input for the DUT, and a signal input for a reference detector;
   a second laser source structured to generate a Local Oscillator input for the DUT;
   a phase maintaining laser coupler having two inputs and two outputs, the first input to the coupler coupled to the output of the first laser source, the second input to the coupler coupled to the output of the second laser source, the first output to the coupler coupled to the reference detector, and the second output to the coupler coupled to the DUT;
   an Acoustic Optic Modulator (AOM) coupled between the second laser source and the LO input to the DUT; in which
   a beat frequency between the signal input for the reference detector and the signal input to the DUT approximates an operational frequency of the AOM.

8. The system for determining a phase angle of a local oscillator relative to a phase angle of a signal input of a Device Under Test (DUT) according to claim 7, further comprising an RF coupler structured to pass the beat frequency to an oscilloscope coupled to the DUT and to the reference detector.

9. The system for determining a phase angle of a local oscillator relative to a phase angle of a signal input of a Device Under Test (DUT) according to claim 7, in which the operational frequency of the AOM is less than 100 MHz.

10. The system for determining a phase angle of a local oscillator relative to a phase angle of a signal input of a Device Under Test (DUT) according to claim 7, further comprising a means for sampling and storing the voltages output by the DUT, in which the stored voltage data is then used to determine the desired relative phase angle.

11. The system for determining a phase angle of a local oscillator relative to a phase angle of a signal input of a Device Under Test (DUT) according to claim 10, in which the means for sampling and storing the voltage data is provided by a digital storage oscilloscope.

12. The system for determining a phase angle of a local oscillator relative to a phase angle of a signal input of a Device Under Test (DUT) according to claim 10, where the desired relative phase angle is obtained from the stored voltage data by least-square fitting to one general sinusoid, or the sum of general sinusoids at different frequencies.

13. A method for determining a phase angle of a local oscillator relative to a phase angle of a signal input of a Device Under Test (DUT), the method comprising:

generating a first laser signal at a first laser, the first laser signal to connect to the DUT;

generating a second laser signal at a second laser, the second laser signal connected to a local oscillator input to the DUT;

coupling a phase of the first laser signal to a phase of the second laser signal in a phase maintaining coupler;

measuring a phase error between the first laser signal and the second laser signal; and compensating for the measured phase error.

14. The method for determining a phase angle of a local oscillator relative to a phase angle of a signal input of a Device Under Test (DUT) according to claim 13, in which compensating for the measured phase error comprises physically adjusting a fiber length of a fiber carrying the first laser signal or a fiber carrying the second laser signal.

15. The method for determining a phase angle of a local oscillator relative to a phase angle of a signal input of a Device Under Test (DUT) according to claim 13, in which physically adjusting a fiber length comprises stretching a loop of fiber.

16. The method for determining a phase angle of a local oscillator relative to a phase angle of a signal input of a Device Under Test (DUT) according to claim 13, in which compensating for the measured phase error comprises sending the measured phase error to an oscilloscope coupled to the output of the DUT, and compensating for the measured phase error in the oscilloscope.

17. The method for determining a phase angle of a local oscillator relative to a phase angle of a signal input of a Device Under Test (DUT) according to claim 16 in which sending the measured phase error to an oscilloscope coupled to the output of the DUT comprises sending the measured phase error from a second oscilloscope.

18. The method for determining a phase angle of a local oscillator relative to a phase angle of a signal input of a Device Under Test (DUT) according to claim 16 in which an Acoustic Optic Modulator (AOM) is coupled between the second laser and the DUT, and in which sending the measured phase error to an oscilloscope coupled to the output of the DUT comprises sending the operating frequency of the AOM.

* * * * *